United States Patent [19]

Wu

[11] Patent Number: 5,902,125
[45] Date of Patent: May 11, 1999

[54] METHOD TO FORM STACKED-SI GATE PMOSFETS WITH ELEVATED AND EXTENDED S/D JUNCTION

[75] Inventor: Shye-Lin Wu, Hsinchu, Taiwan

[73] Assignee: Texas Instruments—Acer Incorporated, Hsinchu, Taiwan

[21] Appl. No.: 08/999,268

[22] Filed: Dec. 29, 1997

[51] Int. Cl.[6] .................................................. H01L 21/336
[52] U.S. Cl. .................... 438/300; 438/305; 438/304; 438/563; 438/952
[58] Field of Search .................................. 438/300, 301, 438/303, 304, 305, 306, 307, 592, 595, 596, 563, 663, 664, FOR 174, FOR 185, FOR 188, 952; 148/DIG. 1

[56] References Cited

U.S. PATENT DOCUMENTS

| | | | |
|---|---|---|---|
| 4,616,401 | 10/1986 | Takeuchi | 438/305 |
| 5,034,348 | 7/1991 | Hartswick et al. | 438/453 |
| 5,168,072 | 12/1992 | Moslehi | 438/305 |
| 5,600,165 | 2/1997 | Tsukamoto et al. | 257/323 |
| 5,674,356 | 10/1997 | Nagayama | 438/703 |
| 5,801,399 | 9/1998 | Hattori et al. | 257/437 |

FOREIGN PATENT DOCUMENTS 5-82784  4/1993  Japan .

OTHER PUBLICATIONS

Shye Lin Wu et al., *Supression of Boron Penetration into an Ultra–Thin Gate Oxide ($\leq 7nm$) by Using a Stacked–Amorphous–Silicon (SAS) Film*, 1993 IEEE, pp. 329–332.

T.p. Ong et al., *CVD $SiN_x$ Anti–reflective Coating for Sub–0.5µm Lithography*, 1995 Symposium on VLSI Technology Digest of Technical Papers, pp. 73 and 74.

T. Yoshitomi et al., *Silicided Silicon–Sidewall Source and Drain ($S^4D$) structure for high–performance 75–nm gate length pMOSFETs*, 1995 Symposium on VLSI Technology Digest of Technical Papers, pp. 11 and 12.

Bijan Davari, *CMOS Technology Scaling, 0.1µm and Beyond*, 1996 IEEE, pp. 555–558.

T. Yoshitomi et al., *High Performance 0.15 µm Single Gate Co Salicide CMOS*, 1996 Symposium on VLSI Technology Digest of Technical Papers, pp. 34 and 35.

*Primary Examiner*—Michael Trinh
*Attorney, Agent, or Firm*—Harness, Dickey & Pierce, P.L.C.

[57] ABSTRACT

The method includes forming a gate oxide on a substrate. A stacked-amorphous-silicon (SAS) layer is then formed on the gate oxide. An anti-reflective coating (ARC) layer is formed on the SAS layer. Next, a gate structure is patterned by etching. A silicon oxynitride layer is formed on the substrate, and covered the gate structure. A BSG sidewall spacers are formed on the side walls of the gate structure. A selective epitaxial silicon is grown on the substrate by using ultra high vacuum chemical vapor deposition. Then, an ARC layer is removed to expose the top of the SAS layer. Then, a blanket ion implantation is carried out to implant p type dopant into the SAS layer, the epitaxial silicon and silicon substrate. A SALICIDE layer, a polycide layer are respectively formed on the SAS layer and the epitaxial silicon. Further, the extended source and drain are formed in the step. A thick oxide layer is formed over the substrate and gate structure for isolation. Then, contact holes are generated in the oxide layer. Next, a metallization is carried out to form electrically connecting structure over the contact holes.

23 Claims, 3 Drawing Sheets

METHOD TO FORM STACKED-SI GATE PMOSFETS WITH ELEVATED AND EXTENDED S/D JUNCTION

The present invention relates to a semiconductor device, and more specifically, to a method of fabricating a metal oxide semiconductor field effect transistor (MOSFET) for used in deep sub-micron meter range.

BACKGROUND OF THE INVENTION

The semiconductor industry has been advanced in an ever brisk pace, recently. In order to achieve high performance integrated circuits or high package density of a wafer, the sizes of semiconductor devices have become smaller and smaller than before in the field of Ultra Large Scale Integrated (ULSI) technologies.

Integrated circuits includes more than millions devices in a specific area of a wafer and electrically connecting structure for connecting these devices to perform desired function. One of the typical devices is metal oxide semiconductor field effect transistor (MOSFET). The MOSFET has been widely, traditionally applied in the semiconductor technologies. As the trend of the integrated circuits, the fabrication of the MOSFET also meets various issues to fabricate them. The typically issue that relates to hot carriers injection is overcame by the development of lightly doped drain (LDD) structure.

Further, the requirement of the devices towards high operation speed and low operation power. For deep sub-micron meter MOS devices, the self-aligned silicide (SALICIDE) contact, ultra-shallow source and drain junction are used for improving the operation speed and short channel effect as seen in reference "Silicided Silicon-Sidewall Source and Drain ($S^4D$) structure for high-performance 75-nm gate length p MOSFETs, T. Yoshitomi et al., 1995, Symposium on VLSI Technology Digest of Technical papers". The highly doped silicon sidewall converted with silicide film are used as a part of source and drain. The extension of the source and drain is produced by the solid-phase diffusion of boron from the highly doped silicon sidewall. In another research by T. Yoshitomi, he develops a high performance CMOS with good control of short channel effect and silicide resistance. Please see "High Performance 0.15 $\mu$m Single Gate Co Salicide CMOS, T. Yoshitomi et al., 1996, Symposium on VLSI Technology Digest of Technical papers". The $CoSi_2$, NiSi have been used for deep sub-micron high speed CMOS due to the low sheet resistance of fine silicide line. However, it is difficult to make ultra-shallow junction and form SALICIDE contact without degrading the device performance.

The requirement of the ULSI CMOS technology is the need of devices operated at low supply voltage and they have high speed. When the supply-voltage is reduced, the threshold voltage needs to be scaled down to achieve the desired circuit switching speed. IBM has proposed that CMOS employs non-uniform channel doping profiles and ultra-shallow source and drain extensions and halos, which can be referenced in "CMOS technology scaling 0.1 $\mu$m and beyond, IBM semiconductor research and development center, Bijan Davari, 1996, IEDM, 96–555". For the high performance case, the threshold voltage is scaled down less than the supply voltage in order to maintain a reasonable standby current.

Further, in order to achieve the low voltage operation with small threshold voltage, the surface channel PMOSFET with the p+ polysilicon gate has been investigated in place of the buried channel with the n+ polysilicon gate due to the superior short channel behavior. Unfortunately, the effect of boron penetration through the thin gate oxide into Si substrate will degrade the device performance. Prior art approaches to overcome these problems have resulted in the development of stacked-amorphous-silicon (SAS) film to suppress the boron penetration into ultra-thin gate oxide. As seen in "Suppression of Boron Penetration into an Ultra-Thin Gate Oxide by Using a Stacked-Amorphous-Silicon (SAS) Film, Shye Lin Wu, 1993, IEDM, p. 329". In this paper, Wu suggests that the use of stacked-amorphous-silicon (SAS) can suppress the boron penetration through an ultra-thin oxide. The SAS gate capacitor exhibits a smaller flat-band voltage shift, a less charge trapping and interface state generation rate than those of the as-deposited poly-Si gate capacitor. The main reason of the suppression of the boron or fluorine penetration by using SAS is because that the SAS structure exhibits the dopant segregation at the stacked-Si boundaries and a longer path for dopant diffusion to the interface between silicon and oxide.

SUMMARY OF THE INVENTION

The method of the present invention includes forming thick field oxide (FOX) regions on the substrate. Next, a silicon dioxide layer is formed on the top surface of the substrate to serve as a gate oxide. A stacked-amorphous-silicon (SAS) layer is then formed on the FOX regions and the silicon dioxide layer. Then, an anti-reflective coating (ARC) layer is formed on the SAS layer to improve the resolution of lithography. Next, the ARC layer, SAS layer and silicon oxide are etched to form a gate structure. Subsequently, a silicon oxynitride layer is formed on the substrate, and covered the gate structure.

A BSG layer is formed on the silicon oxynitride layer. An anisotropical etching is performed to form sidewall spacers on the sidewalls of the gate structure. A first portion of the silicon oxynitride layer on the top of the ARC layer is removed by the etching. A second portion of the silicon oxynitride layer is remained between the gate structure and the BSG sidewall spacers. A third portion of the silicon oxynitride layer laid under the sidewall spacers is also remained on the substrate. The third portion of the silicon oxynitride layer is used as a buffer layer to prevent dopant in the BSG from diffusing into Si substrate. Selective epitaxial silicon is grown on the substrate by using ultra high vacuum chemical vapor deposition. The thickness of the silicon is about 300 to 1000 angstroms.

Then, an ARC layer is removed to expose the top of the SAS layer. Then, a blanket ion implantation is carried out to implant p type dopant, such as boron or BF2 into the SAS layer, the epitaxial silicon and silicon substrate. A refractory or noble metal layer, such as Ti, Pt, Co, W, Ni etc, is sputtered on the substrate and gate structure. Then, a rapid thermal annealing (RTA) in $N_2$ ambient is performed to react the refractory metal with the SAS layer and the epitaxial silicon, thereby forming silicide on these portions. Then, a strip step is used to remove non-reactive refractory metal on the BSG side-wall spacers. Therefore, a SALICIDE layer, polycide layer are self-aligned formed on these regions. Further, the source and drain are formed in the substrate under the SALICIDE layer by the RTA. The RTA also diffuses the dopant from BSG sidewall spacers in the substrate to form extended source and drain. A thick oxide layer is formed over the substrate and gate structure for isolation. Then, contact holes are generated in the oxide layer. Next, a metallization is carried out to form electrically connecting structure over the contact holes.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
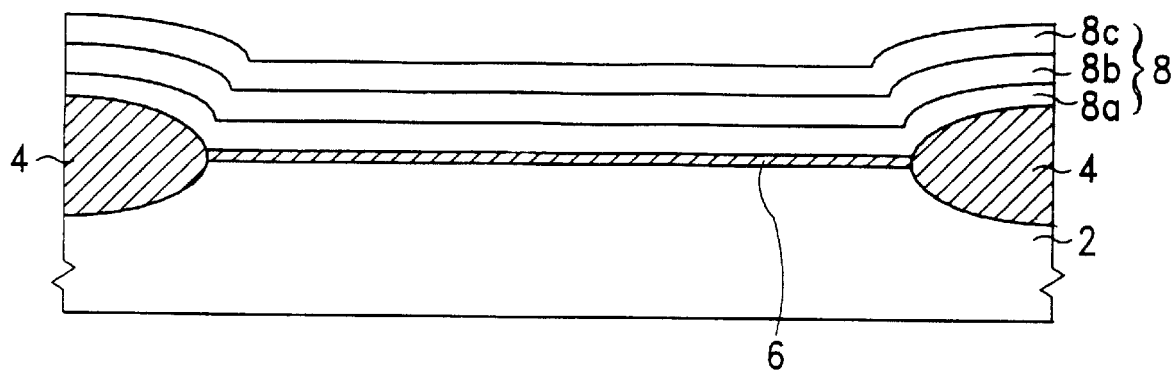
FIG. 1 is a cross section view of a semiconductor wafer illustrating the steps of forming a stacked-amorphous-silicon layer on a semiconductor substrate according to the present invention.

The present invention proposes a novel method to fabricate a self-aligned silicide (SALICIDE) contact deep sub-micron meter p+ poly gate pMOSFET with ultra-shallow extension source and drain junction. In the present invention, the device operation speed can be increased by using the SALICIDE technology. The short channel effect can be suppressed by using the elevated source and drain junction and extension ultra-shallow source and drain junction. Further, the present invention also provides another benefit that is the suppression of the p type dopant penetration effect.

In a preferred embodiment, a single crystal silicon substrate 2 with a <100> crystallographic orientation is provided. Thick field oxide (FOX) regions 4 are formed to provide isolation between devices on the substrate. In a case, the FOX regions 4 can be formed via lithography and etching steps to etch a silicon nitride-silicon dioxide composition layer. After the photoresist is removed and wet cleaned, thermal oxidation in steam environment is used to grow the FOX regions 4 to a thickness of about 3000–8000 angstroms. The FOX regions 4 can be replaced by a plurality of shallow trench isolations, as well known in the art.

Next, a silicon dioxide layer 6 is formed on the top surface of the substrate 2 to serve as a gate oxide of a subsequently formed pMOSFET. Typically, the silicon dioxide layer 6 is formed in an oxygen ambient at a temperature of about 800 to 1100 centigrade degrees. In the embodiment, the thickness of the silicon dioxide layer 6 is approximately 15–250 angstroms. Alternatively, the oxide layer 6 may be formed using any suitable oxide chemical compositions and procedures, such as chemical vapor deposition.

A stacked-amorphous-silicon (SAS) layer 8 is then formed on the FOX regions 4 and the silicon dioxide layer 6 using a low pressure chemical vapor deposition process. In preferred embodiment, the SAS layer 8 is deposited on the gate oxide layer 6 at a temperature about 550 centigrade degrees in three deposition steps, respectively. The total SAS layer 8 is about 1000 to 4000 angstroms. Preferably, each of the sub-layers 8a, 8b, 8c of the SAS layer 8 is respectively 500 to 1000 angstroms. Further, in order to achieve the purpose of suppressing the p type dopant penetration effect, the SAS layer 8 preferably includes at least three sub-layers 8a, 8b, 8c. Then, an anti-reflective coating (ARC) layer 10 is formed on the SAS layer 8 to improve the resolution of lithography. Typically, the $SiN_x$ layer can be used as the ARC layer 10.

Figure 2:
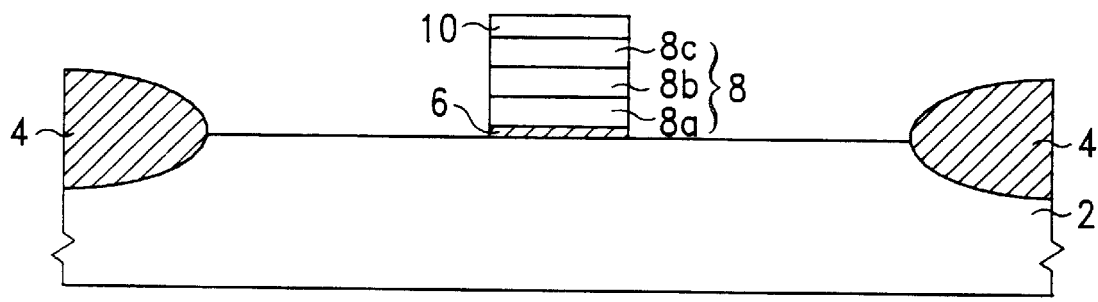
FIG. 2 is a cross section view of a semiconductor wafer illustrating the step of forming a gate structure according to the present invention.

Turning to FIG. 2, next, standard lithography and etching steps are used to etch the ARC layer 10, SAS layer 8 and silicon oxide 6 for forming a gate structure consisting of the gate oxide 6 and the silicon gate 8. Subsequently, a silicon oxynitride layer 12 is formed on the substrate 2, and substantially conformally covered the gate structure. In a case, the silicon oxynitride layer 12 is formed by thermal oxidation in $N_2O$ environment. The temperature for forming the silicon oxynitride layer 12 ranges from 700 to 1150 centigrade degrees. As well known in the art, the etching to pattern the gate structure will cause substrate damage. Thus, the thermal oxidation used to form the silicon oxynitride layer 12 can recover the etching damage caused by the patterning of the gate structure, as shown in FIG. 3.

Figure 3:
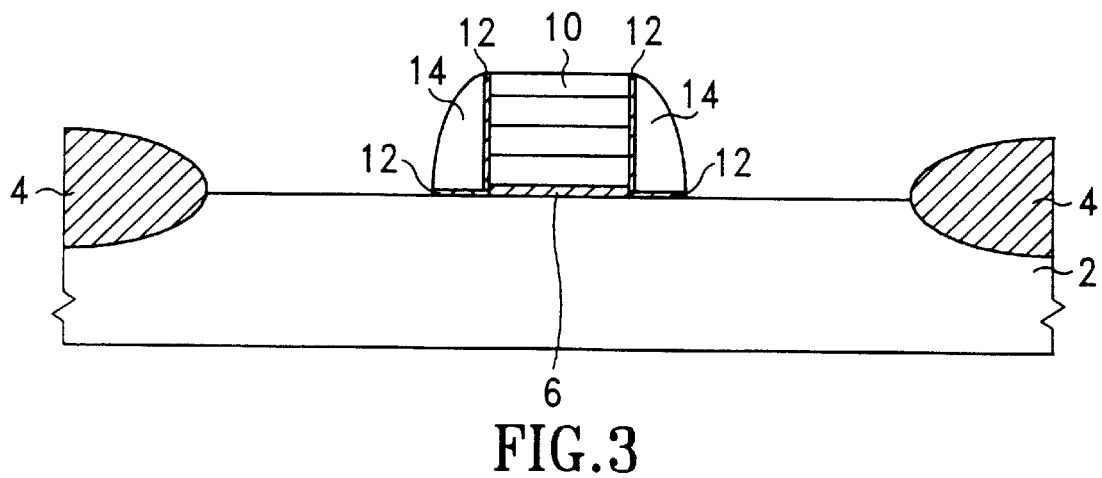
FIG. 3 is a cross section view of a semiconductor wafer illustrating the step of forming sidewall spacers on the sidewalls of the gate structure according to the present invention.

Turning to FIG. 3, sidewall spacers 14 having p type dopant are formed on the sidewalls of the gate structure. In order to achieve this, an anisotropically etching is performed, which is followed by depositing a dielectric layer, such as BSG layer 14, on the silicon oxynitride layer 12. A first portion of the silicon oxynitride layer 12 on the top of the ARC layer 10 is removed by the etching, therefore, the top of the ARC layer 10 is exposed. A second portion of the silicon oxynitride layer 12 is remained between the gate structure and the BSG side-wall spacers 14. Similarly, a third portion of the silicon oxynitride layer 12 laid under the side-wall spacers 14 is also remained on the substrate 2. The third portion of the silicon oxynitride layer 12 is used as a buffer layer to prevent dopant in the BSG 14 from diffusing into Si substrate 2.

Figure 4:
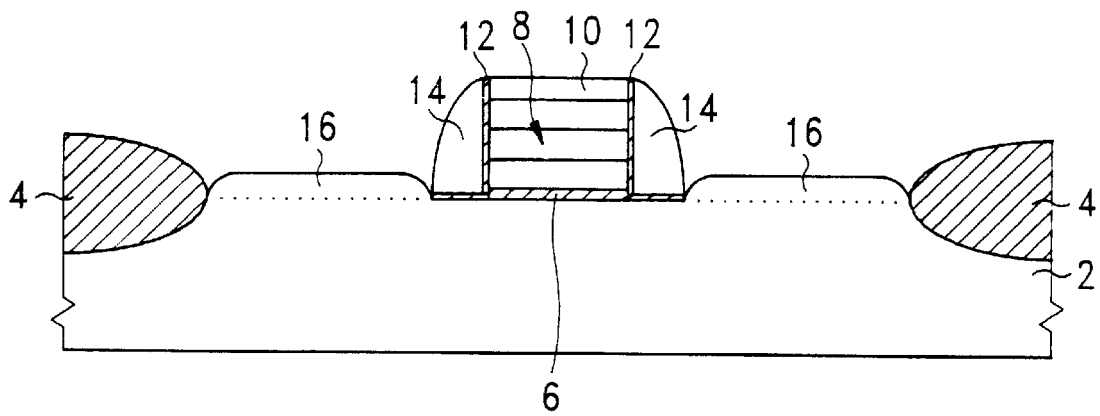
FIG. 4 is a cross section view of a semiconductor wafer illustrating the step of selectively growing epitaxy silicon according to the present invention.

Turning to FIG. 4, a selective Si epitaxy process is performed to grow thin epitaxial silicon 16 on the substrate 2 that is not covered by gate structure, BSG side-wall spacers 14 and FOX regions 4. This step can be done by using ultra high vacuum chemical vapor deposition process at a temperature about 500 to 600 centigrade degrees. The thickness of the silicon 16 is about 300 to 1000 angstroms.

Figure 5:
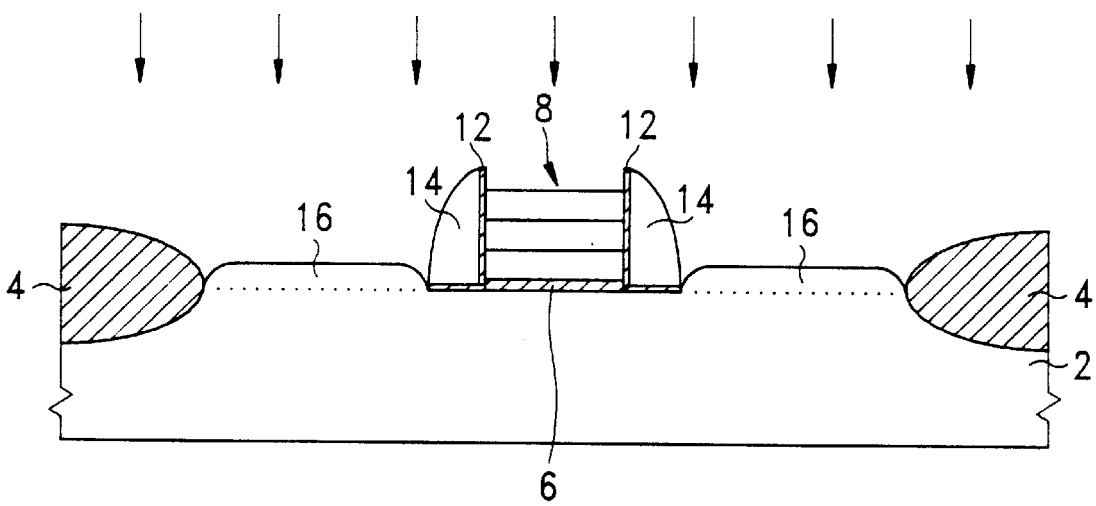
FIG. 5 is a cross section view of a semiconductor wafer illustrating the step of removing an anti-reflective coating layer according to the present invention.
Figure 6:
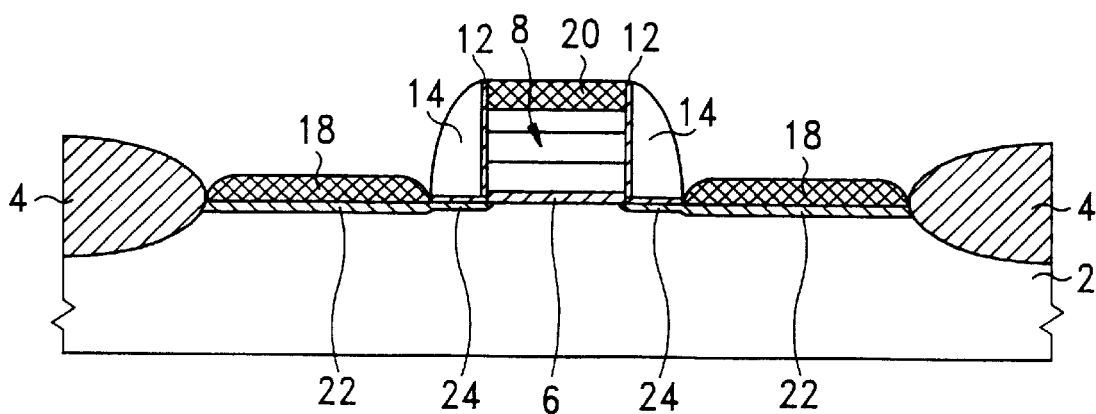
FIG. 6 is a cross section view of a semiconductor wafer illustrating the step of forming a self-aligned silicide and a polycide layer according to the present invention.

Referring to FIG. 5, the ARC layer 10 is then removed to expose the top of the SAS layer 8. Then, a blanket ion implantation is carried out to implant p type dopant, such as boron or BF2 into the SAS layer 8, the epitaxial silicon 16 and silicon substrate 2 that under the epitaxial silicon 16. The dosage and the ion implantation energy of the step are respectively about 2E15 to 2E16 atoms/$cm^2$, about 10 to 100 KeV. As shown in FIG. 6, self-aligned silicide (SALICIDE) layer 18, polycide layer 20 are respectively formed on the substrate 2 exposed by the gate structure, and on the SAS layer 8. Typically, this can be achieved by using well known processes. For example, a refractory or noble metal layer, such as Ti, Pt, Co, W, Ni etc, is sputtered on the substrate 2, gate structure. Then, a first-step rapid thermal annealing (RTA) at 350 to 700 centigrade degrees in $N_2$ ambient is performed to react the refractory metal with the SAS layer 8 and the epitaxial silicon 16, thereby forming silicide on these portions. Then, a strip step is used to remove non-reactive refractory metal on the BSG side-wall spacers 14. Therefore, the SALICIDE layer 18, polycide layer 20 are self-aligned formed on these regions. Further, the source and drain 22 are formed in the substrate 2 under the SALICIDE layer 18 by another high temperature RTA. The temperature of the second-step RTA is about 800–1100 degrees centigrade. The RTA also drives the dopant to diffuse from BSG sidewall spacers 14 into the substrate 2 to form an extended source and drain junction 24 under the sidewall spacers 14.

Figure 7:
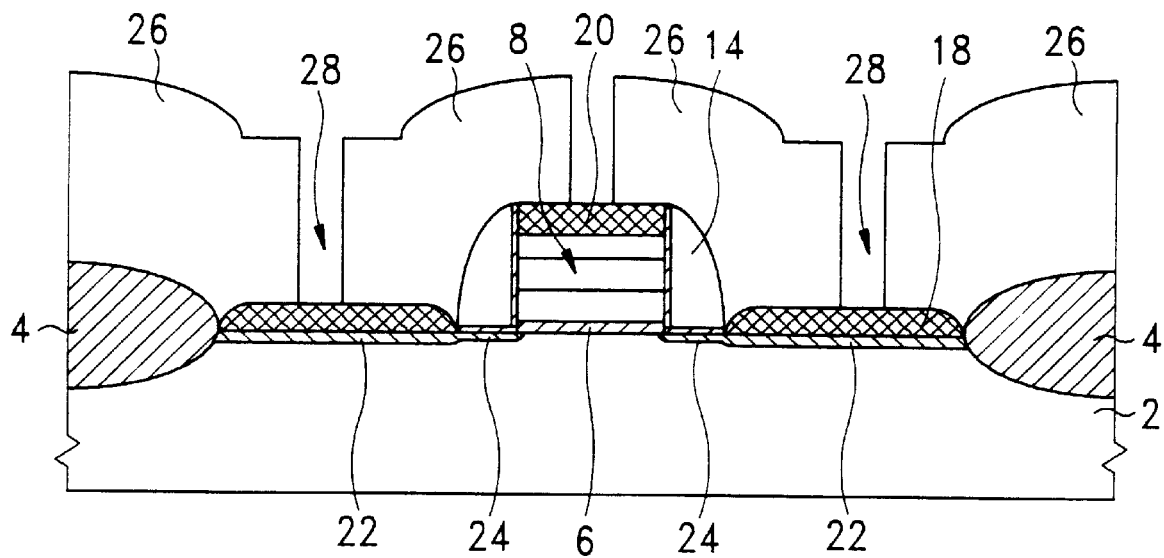
FIG. 7 is a cross section view of a semiconductor wafer illustrating the steps of forming oxide and contact holes according to the present invention.

Referring to FIG. 7, a thick oxide layer 26 is formed over the substrate 2 and gate structure for isolation. For example, CVD oxide can be used for in this step. Then, contact holes 28 are generated in the oxide layer 26 and aligned to the source and drain 22 by using conventional manner.

Figure 8:
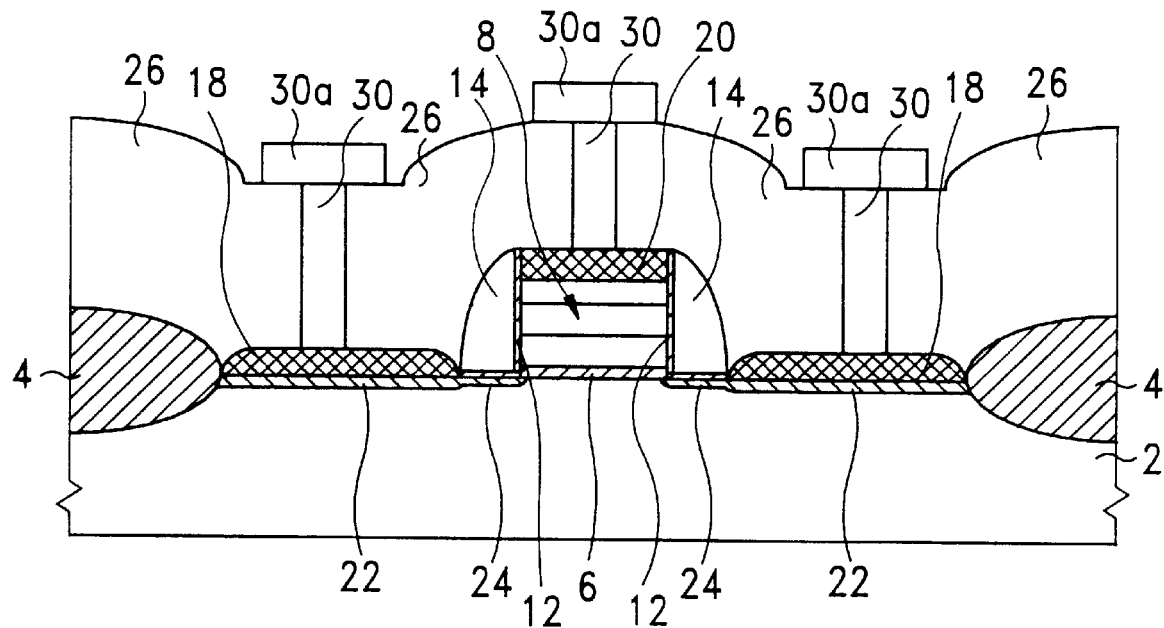
FIG. 8 is a cross section view of a semiconductor wafer illustrating the step of performing a metallization step according to the present invention.

Next, as can be seen by reference to FIG. 8, a metallization is carried out to form electrically connecting structure. As known in the art, a conductive layer 30 is refilled into the contact holes 28 and formed on the oxide layer 26. Then, lithography and etching processes are used to define the conductive pad 30a over the contact holes 28. The conductive pad 30a can be replaced by silicide.

The present invention can provide various benefits over the prior art. For example, the operation speed will be increased by the SALICIDE technology. The short channel effect will be suppressed by using the elevated source and drain junction, and the extended ultra-shallow source and drain junction. Further, The p+ poly-Si gate with minimum boron penetration into thin gate oxide could be achieved by using the stacked-amorphous-silicon structure as the poly gate.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for manufacturing a deep sub micron meter p type transistor on a semiconductor substrate, said method comprising the steps of:

forming a gate oxide layer on said semiconductor substrate;

forming a stacked-amorphous-silicon (SAS) layer on said gate oxide layer;

forming an anti-reflective coating (ARC) layer on said SAS layer;

patterning said ARC layer, said SAS layer, said gate oxide layer to form a gate structure;

forming a first dielectric layer on said semiconductor substrate and said gate structure;

forming a second dielectric layer having p type dopant on said first dielectric layer;

etching said second dielectric layer to form sidewall spacers having p type dopant on sidewalls of said gate structure, a first portion of said first dielectric layer remaining between the gate structure and said side-wall spacers, a second portion of said first dielectric layer remaining under said side-wall spacers;

selectively growing epitaxy silicon on said substrate that is uncovered by said gate structure, said sidewall spacers;

removing said ARC layer;

performing an ion implantation to doped p type dopant into said SAS layer, said epitaxy silicon and through said epitaxy silicon into said substrate;

forming a conductive layer on said SAS layer, said epitaxy silicon and said sidewall spacers; and performing rapid thermal annealing (RTA) process to react said conductive layer with said epitaxy silicon, said SAS layer, thereby respectively forming self-aligned silicide and polycide thereon, and forming source and drain, extended source and drain under said sidewall spacers.

2. The method of claim 1, further comprises following steps after performing said RTA:

forming an isolation layer on said gate structure, said semiconductor substrate;

forming contact holes in said isolation layer; and forming an electrically connecting structure over said isolation layer and in said contact holes.

3. The method of claim 1, wherein said first dielectric layer comprises silicon oxynitride.

4. The method of claim 3, wherein said first dielectric layer is formed by oxidation in $N_2O$ ambient.

5. The method of claim 1, wherein said ARC layer comprises $SiN_x$.

6. The method of claim 1, wherein said second dielectric layer comprises BSG.

7. The method of claim 1, wherein said SAS layer includes at least three sub-layers.

8. The method of claim 7, wherein the total thickness of said SAS layer is about 1000 to 4000 angstroms.

9. The method of claim 8, wherein the thickness of each said sub-layers of said SAS layer is respectively 500 to 1000 angstroms.

10. The method of claim 2, wherein said isolation layer comprises oxide.

11. The method of claim 1, wherein said epitaxy silicon is grown by ultra high vacuum chemical vapor deposition (UHV CVD).

12. The method of claim 1, wherein the thickness of said epitaxy silicon is about 300 to 1000 angstroms.

13. The method of claim 1, wherein said p type dopant for said ion implantation is boron.

14. The method of claim 1, wherein said p type dopant for said ion implantation is $BF_2$.

15. A method for manufacturing a deep sub micron meter p type transistor on a semiconductor substrate, said method comprising the steps of:

forming a gate oxide layer on said semiconductor substrate;

forming a stacked-amorphous-silicon (SAS) layer on said gate oxide layer;

forming a $SiN_x$ layer on said SAS layer as an anti-reflective coating (ARC) layer;

patterning said ARC layer, said SAS layer, said gate oxide layer to form a gate structure;

forming a silicon oxynitride layer on said semiconductor substrate and said gate structure;

forming a BSG layer on said silicon oxynitride layer;

etching said BSG layer to form sidewall spacers on sidewalls of said gate structure, a first portion of said silicon oxynitride layer remaining between the gate structure and said side-wall spacers, a second portion of said silicon oxynitride layer remaining under said sidewall spacers;

selectively growing epitaxy silicon on said substrate that is uncovered by said gate structure, said sidewall spacers;

removing said ARC layer;

performing an ion implantation to doped p type dopant into said SAS layer, said epitaxy silicon and through said epitaxy silicon into said substrate;

forming a conductive layer on said SAS layer, said epitaxy silicon and said sidewall spacers; and performing rapid thermal annealing (RTA) process to react said conductive layer with said epitaxy silicon, said SAS layer, thereby respectively forming self-aligned silicide and polycide thereon, and forming source and drain, extended source and drain under said sidewall spacers.

16. The method of claim 15, wherein said $SiN_x$ layer is formed by oxidation in $N_2O$ ambient.

17. The method of claim 15, wherein said SAS layer includes at least three sub-layers.

18. The method of claim 17, wherein the total thickness of said SAS layer is about 1000 to 4000 angstroms.

19. The method of claim 18, wherein the thickness of each said sub-layers of said SAS layer is respectively 500 to 1000 angstroms.

20. The method of claim 15, wherein said epitaxy silicon is grown by ultra high vacuum chemical vapor deposition (UHV CVD).

21. The method of claim 15, wherein the thickness of said epitaxy silicon is about 300 to 1000 angstroms.

22. The method of claim 15, wherein said p type dopant for said ion implantation is boron.

23. The method of claim 15, wherein said p type dopant for said ion implantation is $BF_2$.

* * * * *